United States Patent
Stewart et al.

(10) Patent No.: US 12,557,654 B2
(45) Date of Patent: Feb. 17, 2026

(54) DIELECTRIC CRACK SUPPRESSION FABRICATION AND SYSTEM

(71) Applicant: Texas Instruments Incorporated, Dallas, TX (US)

(72) Inventors: Elizabeth Costner Stewart, Dallas, TX (US); Jeffrey Alan West, Dallas, TX (US); Thomas Dyer Bonifield, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 909 days.

(21) Appl. No.: 17/558,017

(22) Filed: Dec. 21, 2021

(65) Prior Publication Data

US 2023/0197634 A1   Jun. 22, 2023

(51) Int. Cl.
*H01L 23/00* (2006.01)
*H01L 23/58* (2006.01)
*H10D 1/20* (2025.01)

(52) U.S. Cl.
CPC .......... *H01L 23/562* (2013.01); *H01L 23/585* (2013.01); *H10D 1/20* (2025.01)

(58) Field of Classification Search
None
See application file for complete search history.

(56) References Cited

U.S. PATENT DOCUMENTS

| | | |
|---|---|---|
| 11,069,627 B2 | 7/2021 | Bonifield et al. |
| 2019/0378892 A1 | 12/2019 | Costner et al. |
| 2020/0035779 A1* | 1/2020 | Huang .............. H01L 21/76804 |
| 2020/0106009 A1* | 4/2020 | Wu ........................ H10N 50/01 |
| 2022/0093461 A1* | 3/2022 | Chung .............. H01L 21/76831 |

OTHER PUBLICATIONS

U.S. Appl. No. 17/514,786, entitled "Integrated Circuit Device With Improved Oxide Edging", filed Oct. 29, 2021.

* cited by examiner

*Primary Examiner* — Bo B Jang
(74) *Attorney, Agent, or Firm* — Yudong Kim; Frank D. Cimino

(57) ABSTRACT

An integrated circuit with a first conductive region, a second conductive region, a plurality of dielectric layers of a first material type between the first conductive region and the second conductive region, and at least one dielectric layer of a second material type, between a first dielectric layer in the plurality of dielectric layers of a first material type and a second dielectric layer in the plurality of dielectric layers of the first material type. Each dielectric layer of a first material type has a thickness in a range from 0.5 μm to 5.0 μm, and the at least one dielectric layer of a second material type is not contacting a metal and has a thickness less than 2.0 μm, and the second material type differs from the first material type in at least one of compression stress or elements in the first material type as compared to elements in the second material type.

25 Claims, 4 Drawing Sheets

DIELECTRIC CRACK SUPPRESSION FABRICATION AND SYSTEM

CROSS-REFERENCE TO RELATED APPLICATION

Not applicable.

BACKGROUND

The examples relate to semiconductor fabrication, for example with respect to forming relatively thick dielectric structures, such as in integrated circuit (IC) high voltage isolation capacitors and transformers.

Isolation devices in ICs are often constructed from relatively thick dielectric layers, or by a stack of such layers, for example in contemporary processes having total thickness greater than 8 μm. While the total stack thickness typically provides sufficient electrical isolation, the dielectric stack layers typically are deposited with compressive stress that can cause the underlying silicon substrate (wafer) containing the devices to bow or warp excessively, potentially rendering the wafer unable to be processed to completion. To address this, the dielectric deposition process can be modified to reduce the stress of all or some of the dielectric layers in the stack, thereby lowering the overall wafer bow impact. Lower stress dielectric films, however, are more prone to form and propagate cracks during semiconductor wafer processing or die singulation where a rotating diamond embedded saw blade is used to cut through the thick dielectric stack to separate the individual die from the large die array contained within the wafer. Lower stress dielectrics, particularly silicon dioxide, are also more susceptible to moisture absorption, which can degrade the dielectric quality and cause poor high voltage isolation performance.

Accordingly, there may be a need to provide improved thick oxide stacks, and this document provides examples that may improve on certain of the above concepts, as detailed below.

SUMMARY

An integrated circuit is described, comprising a first conductive region, a second conductive region, and a plurality of dielectric layers of a first material type between the first conductive region and the second conductive region. Each dielectric layer of a first material type has a thickness in a range from 0.5 μm to 5.0 μm. The integrated circuit further comprises at least one dielectric layer of a second material type, between a first dielectric layer in the plurality of dielectric layers of a first material type and a second dielectric layer in the plurality of dielectric layers of the first material type and not contacting a metal, wherein the at least one dielectric layer of a second material type has a thickness less than 2.0 μm and wherein the second material type differs from the first material type in at least one of compression stress or elements in the first material type as compared to elements in the second material type.

Other aspects are also described and claimed.

DETAILED DESCRIPTION

Figure 1:
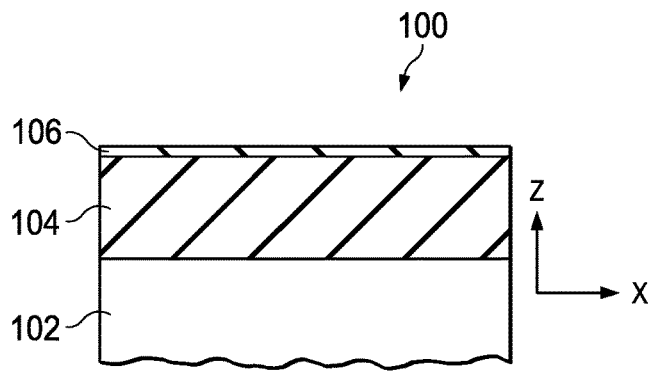
FIG. 1 is a cross-sectional partial view of a semiconductor structure in a relatively early fabrication stage.

FIG. 1 is a cross-sectional partial view of a semiconductor structure 100, in a relatively early fabrication stage. Ultimately, the semiconductor structure 100 will provide one or more thick dielectric stacks, for example of 8 μm or more, in an IC die. As one example, the IC die may provide an isolation capacitor, as may be used in a high voltage application. As another example, the IC die may provide a transformer. These may be standalone components or either may be in larger functional ICs. Additionally, each may be singularly packaged or combined with one or more other die within a package, forming for example a multi-chip module (MCM) and/or a small outline IC (SOIC). Still further, examples are provided with dielectric stack improvement, as may be implemented at one or more levels in an IC, for example between the semiconductor substrate and a first metal layer (sometimes referred to as M1 or metal-1), and/or between higher metal layers (e.g., between metal-1 and metal-2, or higher).

The semiconductor structure 100 includes a semiconductor substrate 102, for example formed of silicon. For sake of FIG. 1 and later figures, x-z coordinate dimensions are also illustrated, with the x-dimension generally considered horizontal and the z-dimension generally considered vertical. The directional references are for purposes of relative placement, but such terms are not intended to be restrictive as the device may be rotated in space and thereby change absolute, but not relative, references. A first pre-metal dielectric (PMD) layer 104 is formed adjacent the semiconductor substrate 102, where FIG. 1 and later figures show the device as vertical and with generally horizontal layering, so the first PMD layer 104 is illustrated above, and in contact with, the semiconductor substrate 102. In an example, the first PMD layer 104 is a plasma enhanced chemically vapor deposited (PECVD) oxide formed from a tetraethyl orthosilicate (TEOS) precursor, hereafter referred to simply as TEOS. The TEOS may be low stress, having a compressive stress between −10 and −80 MPa (e.g., −20 MPa). The use of low stress material may be preferred, particularly where TEOS or other dielectrics are implemented in relatively thick layers (or serve as layers that combine to form a stack), as thick, higher compressive stress layers, can create undesirable levels of wafer bow, which exceed the limits that can be tolerated by typical wafer fabrication processing equipment. The first PMD layer 104 thickness, shown in FIG. 1 and later figures in the z-dimension, may vary, for example in the range of 0.5 μm to 5.0 μm thick (e.g., 3 μm). Notably, the thickness of the first PMD layer 104, as well as its stress, could cause cracks to form in the layer, that is, a relatively thin stack can crack, even at relatively lower stress. Responsive to these considerations, a first thin intermediate dielectric layer 106 is formed above and in contact with the first PMD layer 104. In an example, the thin intermediate dielectric layer 106 is silicon oxynitride, having the form of $SiO_aN_b$, where a=b or where both a and b can be unequal to one another, and where each of a and b is in a range from 2.0 to 3.6. Varying a and b allows different examples with respective tuning of material properties, including the compressive strength of the silicon oxynitride. Further in an example, the processing parameters (e.g., radio frequency, bias conditions, pressure) may be adjusted to tune the compressive stress of the $SiO_aN_b$ of the thin intermediate dielectric layer 106 to be in the range of 0 MPa to −170 MPa. The thickness of the first thin intermediate dielectric layer 106 may vary, for example in the range of 0.1 and 0.5 μm thick (e.g., 0.3 μm). The thickness of the thin intermediate dielectric layer 106 can be approximately 5% to 20% (e.g., 10%) of the thickness of the first PMD layer 104. Additionally or alternatively, the thickness of the thin intermediate dielectric layer 106 can be chosen in absolute terms, rather than relative to the thicker PMD layer, in all events such that the composition of the bulk of the dielectric stack, that includes both the first PMD layer 104 and the first thin intermediate dielectric layer 106, is nearer to that of the first PMD layer 104, in order to avoid any material change to the electrical performance of the stack, for example to avoid affecting leakage, capacitance, breakdown, and the like.

Figure 2:
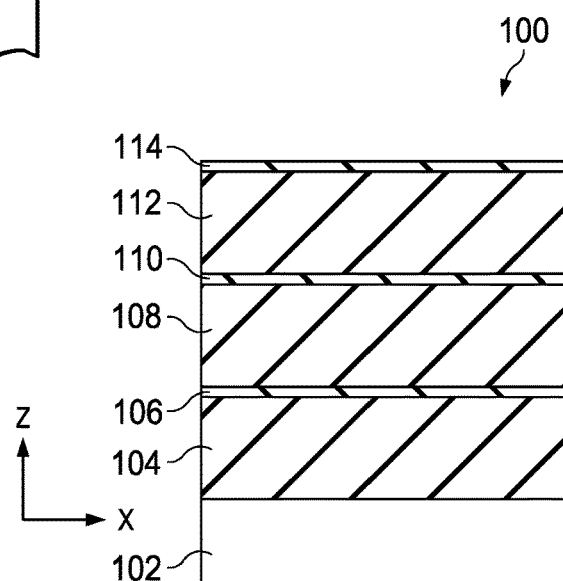
FIG. 2 is a cross-sectional partial view of the FIG. 1 semiconductor structure following additional fabrication.

FIG. 2 is a cross-sectional partial view of the FIG. 1 semiconductor structure 100, following additional fabrication. A second PMD layer 108 is formed above the first thin intermediate dielectric layer 106. In an example, the second PMD layer 108 is of the same material (TEOS), and also may be of the low compressive stress, and thickness (e.g., 3 μm), of the first PMD layer 104. Further, while FIG. 2 (and others) show only a limited amount of the horizontal space of the stack, or just the stack alone but not other components affixed to or within the semiconductor substrate 102, note in an example that across the entirety of the structure, including potentially beyond that which is shown, the thin intermediate dielectric layer 106 does not physically contact any metal, in the z-dimension either above or below those layers, for example by contacting a horizontal metal layer, or in the x-dimension laterally, for example by contacting a vertical metal via or contact. A second thin intermediate dielectric layer 110 is formed above the second PMD layer 108. In an example, the second thin intermediate dielectric layer 110 is of the same material ($SiO_aN_b$), and may be of the same compressive stress and thickness (e.g., 0.3 μm), as the first thin intermediate dielectric layer 106. In an example, the second thin intermediate dielectric layer 110 also does not physically contact metal, in either the x-dimension or the z-dimension.

Continuing in FIG. 2, the same pairing of PMD layer and thin dielectric layer is again repeated above and adjacent the preceding structure. Specifically, a third PMD layer 112 is formed above and in contact with the second thin intermediate dielectric layer 110. In an example, the third PMD layer 112 is of the same material (TEOS), and also may be the same compressive stress and thickness (e.g., 3 μm), as the first PMD layer 104. A third thin intermediate dielectric layer 114 is formed above and in contact with the third PMD layer 112. In an example, the third thin intermediate dielectric layer 114 is of the same material ($SiO_aN_b$), and may be of the same compressive stress and thickness (e.g., 0.3 μm), as the first thin intermediate dielectric layer 106. Additionally, the third thin dielectric layer 114, again across the entirety of the structure including beyond that which is shown does not physically contact any metal, in either the z-dimension or the x-dimension.

Figure 3:
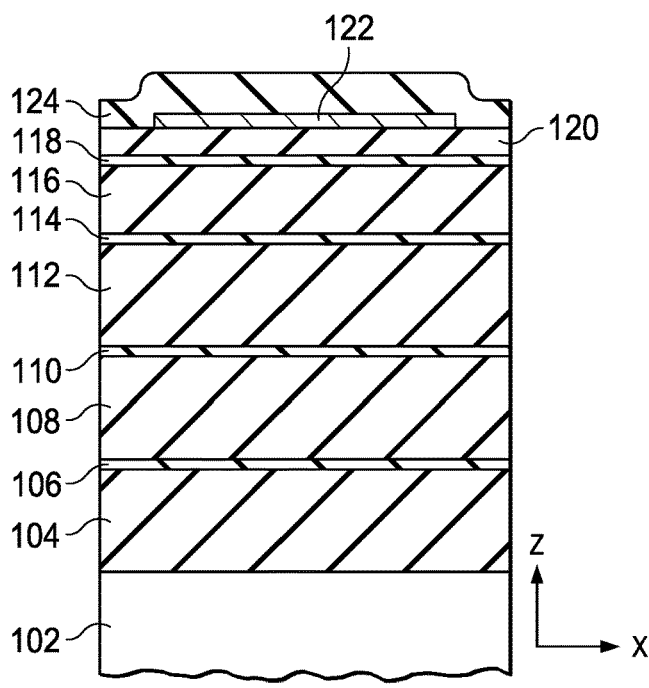
FIG. 3 is a cross-sectional partial view of the FIG. 2 semiconductor structure, following additional fabrication.

FIG. 3 is a cross-sectional partial view of the FIG. 2 semiconductor structure 100, following additional fabrication. A fourth PMD layer 116 is formed above and in contact with the third thin intermediate dielectric layer 114. In an example, the fourth PMD layer 116 is of the same material (TEOS), and also may be the same compressive stress, as the first PMD layer 104, but it may be of a lesser thickness, for example a thickness of 2 μm. Accordingly, at this point, a person of skill in the art will appreciate that for each of the first, second, and third thin intermediate dielectric layers 106, 110, and 114, it physically abuts a first and second dielectric (e.g., PMD) layer, where the first and second dielectric layer is of a same material, or includes the same elements (e.g., silicon, oxygen, carbon and hydrogen, such as in TEOS; silicon and oxide, such as in silicon dioxide; carbon, silicon, oxygen, and fluorine, such as in organosilicon), where in examples those elements do not include nitrogen, and at least one of the first and second dielectric layers has a thickness of at least 2 μm, while the other dielectric layer has a thickness of 0.5 μm or greater, so that combined the two dielectric layer have a thickness of 2.5 μm or greater. Accordingly, in each instance, the thin intermediate dielectric layer separates what otherwise could be a continuous stack of dielectric of those first and second dielectric layers. As further discussed later, the inclusion of any of the thin intermediate dielectric layers 106, 110, and 114 (and others, discussed later) reduces the possibility of cracking through a combined thickness of the layer above and below it, or of the combined thickness of all of the PMD layers, as each thin intermediate dielectric layer serves also as a crack stop, as between otherwise adjacent thicker (e.g., TEOS) layers.

Completing FIG. 3, other aspects are shown as an example of an implemented device. For example, a fourth thin intermediate dielectric layer 118 may be formed above and in contact with the fourth PMD layer 116. In an example, the fourth thin intermediate dielectric layer 118 is of the same material ($SiO_aN_b$), and may be of the same compressive stress and thickness (e.g., 0.3 μm), as the first thin intermediate dielectric layer 106. A first silicon nitride (SiN) layer 120, which in an alternative example may be TEOS, is formed above and in contact with the fourth thin intermediate dielectric layer 118. While four thin intermediate layers and four PMD layers are shown, the number of thin intermediate layers may be as few as one or greater than four. For example, a thin intermediate layer may be located for every 0.5 to 3.0 μm of PMD layer thickness. In an example, the first SiN layer 120 may have a thickness of 0.65 μm, and can provide benefits in connection with electric fields, particularly near corners, of nearby metals. Additionally, a first metal layer 122 (e.g., M1 or metal-1) is formed above and in contact with the first SiN layer 120. In an example, the first metal layer 122 may be formed by depositing or sputtering, patterning, and an etching a metal layer (e.g., aluminum), and with the resultant metal layer thickness in a range from 0.5 μm to 3.0 μm. Given the preceding, the layers between the first metal layer 122 and the substrate 102 cumulatively provide a dielectric thickness of over 11.0 μm, which reduces the impact of parasitic capacitance occurring between the first metal layer 122 and a conductive region (including a charged region) of the substrate 102. Lastly in FIG. 3, a first high stress TEOS layer 124 is formed above and preferably conforming to and covering the top corners and sidewalls of the first metal layer 122. The first high stress TEOS layer 124 may have a compressive stress between −80 and −150 MPa (e.g., −120 MPa). High stress TEOS used in this manner reduces the amount of moisture absorption into the film adjacent the metal layer 122, thereby mitigating potential problems (e.g., high voltage failures) that otherwise might arise from elevated moisture levels. In an example, the first high stress TEOS layer 124 has a thickness between 0.5 μm and 3.0 μm (e.g., 1.0 μm). In alternate examples, the first high stress TEOS layer 124 can be a layer of high density plasma (HDP) oxide, which also has high compressive stress.

Figure 4:
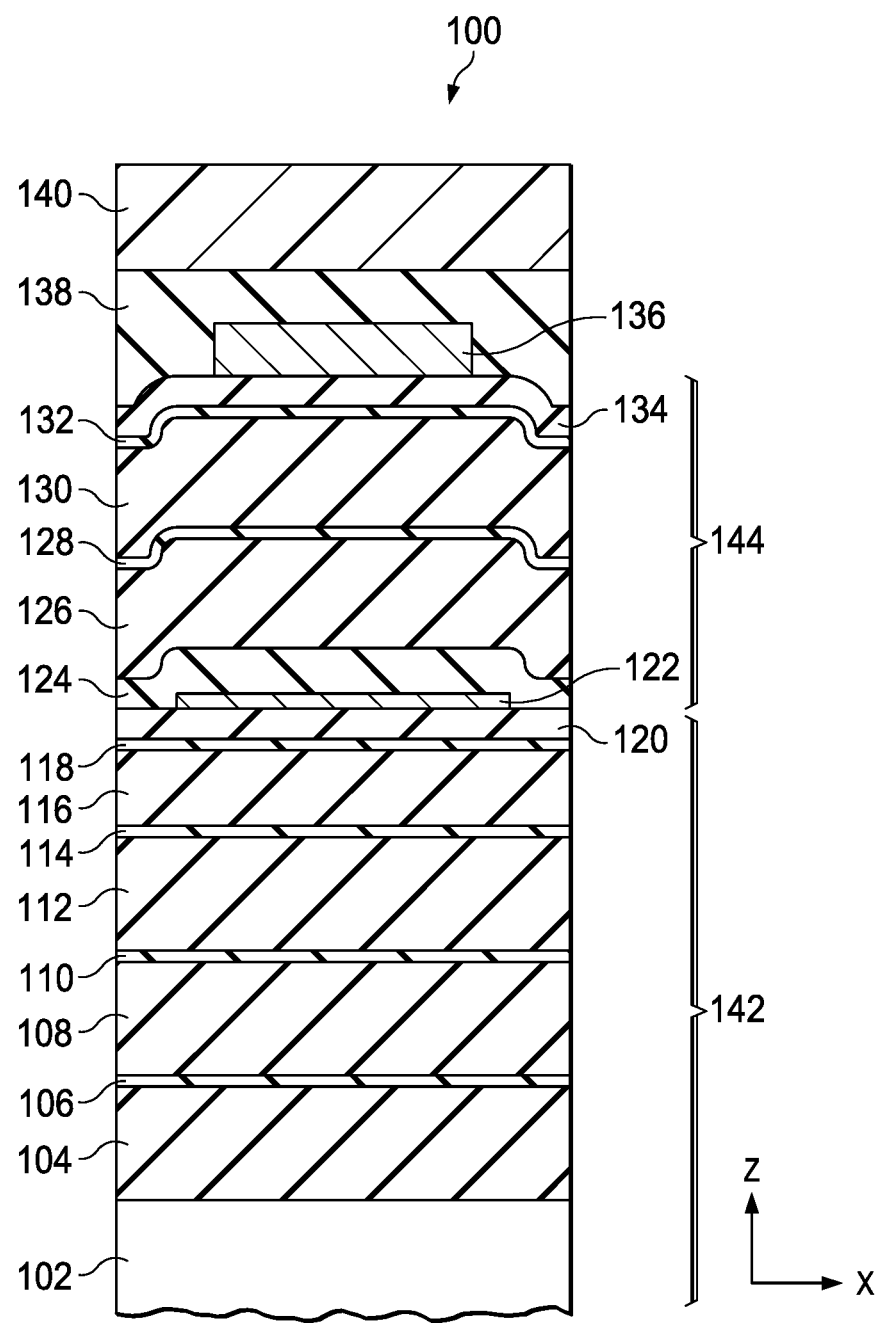
FIG. 4 is a cross-sectional partial view of the FIG. 3 semiconductor structure, following additional fabrication.

FIG. 4 is a cross-sectional partial view of the FIG. 3 semiconductor structure 100, following additional fabrication. Particularly, above the first high stress TEOS layer 124, a second stack of thick insulation is formed, again including alternating layers of low stress TEOS separated by a thinner nitrogen-containing layer (e.g., $SiO_aN_b$). Specifically, a first inter-level dielectric (ILD) layer 126 is formed above and in contact with the first high stress TEOS layer 124. In an example, the first ILD layer 126 is of the same material (TEOS), low compressive stress, and thickness (e.g., 3.0 μm) as the first PMD layer 104. A fifth thin intermediate dielectric layer 128 is formed above and in contact with the first ILD layer 126. In an example, the fifth thin intermediate dielectric layer 128 is of the same material ($SiO_aN_b$), compressive stress, and thickness (e.g., 0.3 μm) as the first thin intermediate dielectric layer 106. Further, a second ILD layer 130 is formed above and in contact with the fifth thin intermediate dielectric layer 128. In an example, the second ILD layer 126 is of the same material (TEOS), and may be of the same low compressive stress and thickness (e.g., 3.0 μm), as the first PMD layer 104. A sixth thin intermediate dielectric layer 132 may be formed above and in contact with the second ILD layer 130. In an example, the sixth thin intermediate dielectric layer 132 is of the same material ($SiO_aN_b$), compressive stress, and thickness (e.g., 0.3 μm) as the first thin intermediate dielectric layer 106. While two ILD layers and two thin intermediate dielectric layers are shown, additional iterations of an ILD layer and a thin intermediate dielectric layer may also be formed.

Continuing in FIG. 4, a second SiN layer 134, which in an alternative example is TEOS, is formed above and in contact with the sixth thin intermediate dielectric layer 132. In an example, the second SiN layer 134, like the first SiN layer 124, may have a thickness of 0.65 μm. A second metal layer 136 (sometimes referred to as M2 or metal-2 in a standalone device, but could be higher metal layer in an IC with functional circuitry) is formed above and in contact with the second SiN layer 134. In an example, the second metal layer 136 may be formed in a same manner as the first metal layer 122, and with the resultant metal layer thickness of up to 3.0 μm. Accordingly, the layers between the second metal layer 136 and the first metal layer 122, excluding the second SiN layer 134, cumulatively provide a dielectric thickness of approximately 8.3 μm, to create a galvanic high voltage isolation capacitor between the second metal layer 136 and the first metal layer 122. Further, the inclusion of the thin intermediate dielectric layers 128 and 132 also reduces the possibility of cracking through the entire thickness, as each thin intermediate dielectric layer serves also as a crack stop, as between otherwise adjacent thicker (e.g., TEOS) layers. Also in FIG. 4, a second high stress TEOS or high density plasma (HDP) oxide layer 138 is formed above and preferably conforming to and covering the top corners and sidewalls of the second metal layer 136. The second high stress TEOS or HDP oxide layer 138 may be thicker than (e.g., 1.4 μm), but may have a same compressive stress as, the first high stress TEOS layer 124, reducing the amount of moisture accumulation in the film directly adjacent to the second metal layer 136. An additional protective oxide or overcoating may be formed above the second high stress TEOS layer 138, for example with a layer 140 of low stress $SiO_aN_b$.

While not shown, an opening also may be formed through the layer 140 and the TEOS layer 138, so as to provide electrical contact to the second metal layer 136. Alternatively, the second metal layer 136, and also the semiconductor substrate 102, may be left floating, where the semiconductor structure 100 provides a capacitively coupled high voltage capacitor; additional details in this regard are shown in co-owned U.S. patent application Ser. No. 16/435, 095, filed Jun. 7, 2019 and published as U.S. Patent Publication 20190378892 on Dec. 12, 2019, which is hereby fully incorporated herein by reference.

Given the preceding, FIG. 4 further identifies that the semiconductor structure 100 includes generally a first dielectric stack 142 between two conductive regions, with the FIG. 4 example conductive regions being the first metal layer 122 and the semiconductor substrate 102 (including a charged portion thereof), and a second dielectric stack 144 between two conductive regions, with the FIG. 4 example conductive regions being the second metal layer 136 and the first metal layer 122. In alternative examples, one or both of stacks 142 and 144 may be included. Each respective stack 142 and 144 includes plural thicker layers of a first dielectric type and between those thicker layers is an adjacent (e.g., physically abutting) thinner layer of a second dielectric type. Accordingly, within each stack 142 and 144, the included thinner and different dielectric creates a dielectric dissimilar interface, which provides a stop to cracks that otherwise may occur (e.g., vertically in the orientation shown) through thicker dielectric layers. In an example, the inclusion of nitrogen in the thinner dielectric, for example in the form of $SiO_aN_b$, may reduce moisture presence in that material and accordingly at its interface with the abutting thicker low stress TEOS layer. Reducing moisture likewise may reduce crack propagation in the same area, so accordingly the interface reduces the risk of vertical crack propagation in the stack (either 142 or 144), while also facilitating sufficient electrical isolation. Further, in an alternative example, the dissimilar interface might be provided by an alternative combination of materials for the thicker (PMD or ILD) layer versus the thinner intermediate layer. As an example, again using low compressive stress TEOS for the thicker layers as shown the FIGS. 1-4, a high stress (e.g., $^-80$ MPa<stress<$^-$170 MPa) TEOS may be used for the thinner intermediate layers. While the high stress TEOS does not include nitrogen, the higher stress nature creates an interface with the lower stress thicker TEOS which may serve to inhibit cracks or at least stop them from extending a distance greater than the thickness of the thicker low stress TEOS (e.g., 2.0 to 5.0 μm).

Figure 5:
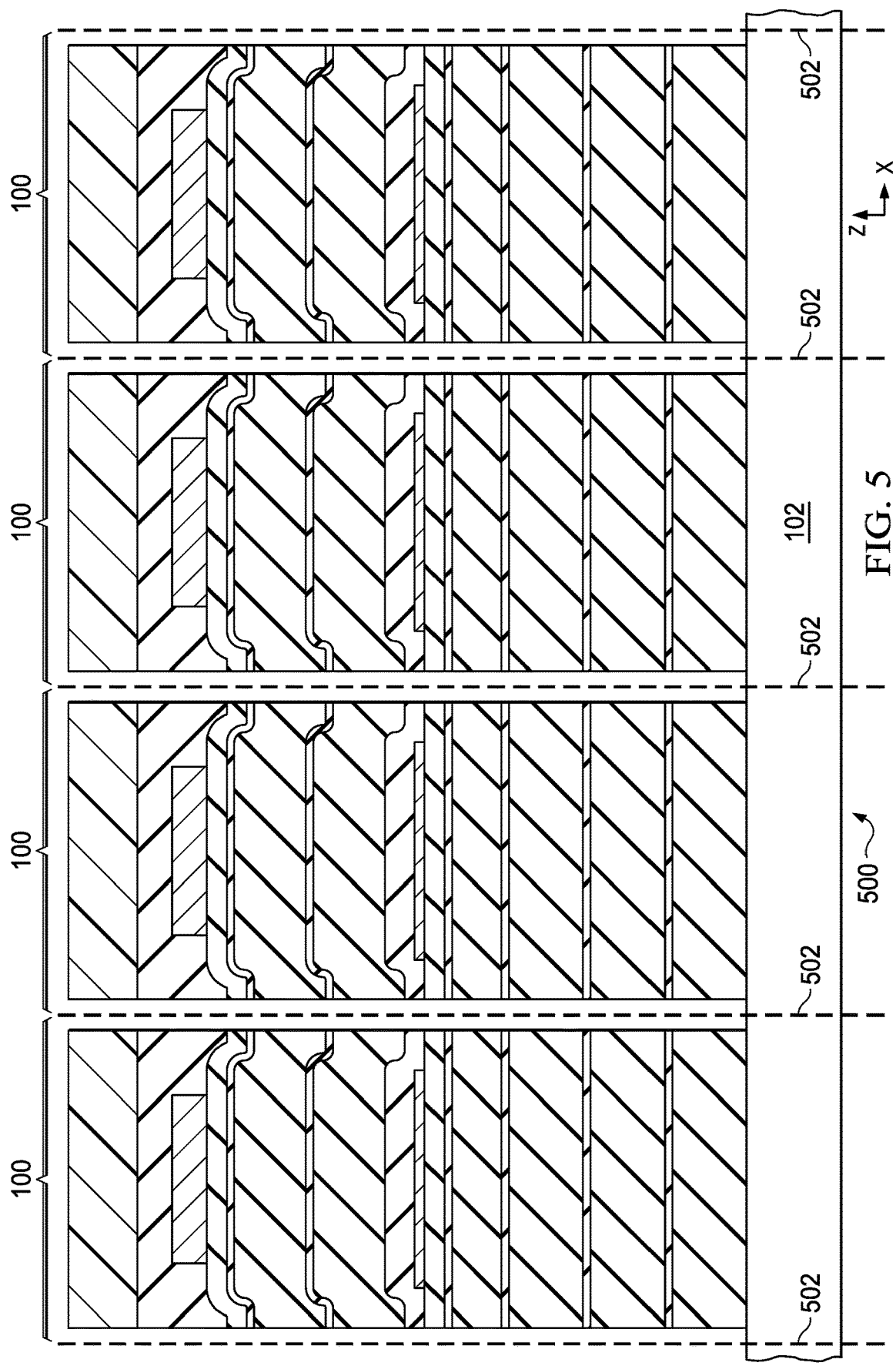
FIG. 5 is a simplified illustration of a wafer assembly, including a plural number of the FIG. 4 semiconductor structures.

FIG. 5 is a simplified illustration of a wafer assembly 500, including a plural number (e.g., four) of the semiconductor structures 100 on the substrate 102. To the left and right of each individual semiconductor structure 100, a cut line 502 is shown. Each cut line 502 represents a position where a cut is made, typically using a specialized mechanical saw and saw blade, to separate (singulate) each individual semiconductor structure 100 from the other(s), once all fabrication steps are complete. Each then-singulated semiconductor structure 100 provides a separate IC die, which may be packaged alone or in combination with one or more other IC die. For sake of simplification, FIG. 5 illustrates the area around each cut line 502 as vacant, but in actuality that area may be filled with other materials, including for example isolation oxides, polyimide, and/or lateral extensions of the layers of each semiconductor structure 100. Prior to singulation, the wafer assembly 500 may be scribed in the area of each cut line 502, to reduce the probability of cracks forming in any of the semiconductor structures 100 during subsequent sawing or cutting. The scribe can form a trench, for example in any overlying protective dielectric layer (not separately shown). Thereafter, the cutting saw or the like is advanced in the trench and along the cut line 502.

The above-described cutting is one of various potential causes of cracks through the thick oxides of any of the semiconductor structures 100. Indeed, in some prior art IC die, the die components may include a so-called scribe seal, or multiple scribe seals, which are typically formed of metal stacks that span most or all of the layer stack and are included around the die edge periphery. For example, the scribe seal may span between successive metal and tungsten (W) via layers (e.g., metal-1 to metal-2, or so forth). Accordingly, the metal stack also can serve a conductive path purpose between different metal layers within each IC die. Examples of such scribe seals may be found in co-owned U.S. Pat. No. 11,069,627, issued Jun. 20, 2021, which is hereby fully incorporated herein by reference. Additionally, the metal and W-via scribe seal adds crack propagation protection, for example as against lateral cracks that may otherwise occur between die components during saw for singulation. In contrast, the wafer assembly 500 is without such metal and W-via scribe seal stacks, for example where each of the semiconductor structures 100 is of a particular device type, such as the FIG. 1-4 isolation capacitor, and so that inter-metal layer connections are not implemented. Accordingly, in the examples illustrated, the scribe area does not include metal, so that none of the thin intermediate dielectric layers contacts a metal. Accordingly, the crack inhibiting features obtained from the above-described combination of layers may be exceedingly beneficial, for examples that do not include the augmentation of metal scribe seals. Moreover, the inclusion of crack inhibiting features may reduce cracks arising from other fabrication considerations. For example, cracks also might occur during fabrication processing when particles that fall on the wafer become embedded under thick dielectrics and create nucleation sites for crack propagation. The example inclusion of thinner layers also can inhibit cracks generated from such fall-on particles, or potentially other crack causes incurred in normal fabrication processing.

Figure 6:
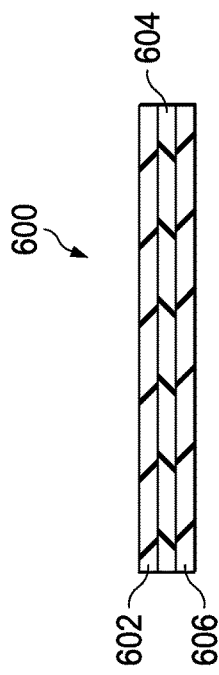
FIG. 6 is a cross-sectional view of an alternative thin intermediate dielectric layer as may be used in the examples of FIGS. 1-5.

Additional alternative examples include variations in the materials, and layering, that may be used as a substitute for various above-described thin intermediate dielectric layers (e.g., 106, 110, 114, and so forth). In one example, the value of a in $SiO_aN_b$ is reduced to zero, so that one or more of the thin intermediate dielectric layers is formed from SiN (silicon nitride). In another example, the thin intermediate dielectric layer does not contact any conductive or semiconductor material (e.g., the thin intermediate dielectric layer contacts only other dielectric material). In another example, the thin intermediate dielectric layer is formed from an alternative dielectric, including an insulator that does not include nitrogen, for example as either aluminum oxide or titanium oxide. In still another example, the thin intermediate dielectric layer may be implemented as a stack that includes plural layers. For example, FIG. 6 is a cross-sectional view of an alternative thin intermediate dielectric layer 600, again as may be used as a substitute for the first thin intermediate dielectric layer 106 (and/or for others, such as 110, 114, etc.). The alternative thin intermediate dielectric layer 600 is a multi-layered structure, including a first layer 602, a second layer 604, and a third layer 606, each of a material consistent with other thin intermediate dielectric layers described herein, and with the total thickness of the multi-layered structure also being in the range of 0.1 and 0.5 µm thick (e.g., 0.3 µm). For example, each of the first, second, and third layers 602, 604, and 606 may be 0.1 µm thick, so that in total the first alternative thin intermediate dielectric layer 600 is 0.3 µm thick. Further, in one example, the material of the first layer 602 and the third layer 606 may be the same, while the material of the second layer 604, between the first and third layers 602 and 606, is different. For example, the first and third layers 602 and 606 may be silicon oxynitride, while the second layer is silicon nitride, in which case all such layers include nitride. With this material selection, the outer material-to-material interface between the first alternative thin intermediate dielectric layer 600 and an abutting thicker dielectric layer (e.g., the first and second PMD layers 104 and 108), is the same both above and below the first alternative thin intermediate dielectric layer 600, for example with the interface having silicon oxynitride abutting TEOS. As still another alternative, the thin intermediate dielectric layer 600 can remain a multi-layered structure, including only two of the three-illustrated layers of the first layer 602, the second layer 604, and the third layer 606, again with a combined thickness being in the range of 0.1 and 0.5 µm thick (e.g., 0.3 µm), for example with each layer including nitrogen, but one of the two layers having otherwise some different element(s). For example, a first of the two layers could be silicon oxynitride, while a second of the two layers is silicon nitride.

Figure 7:
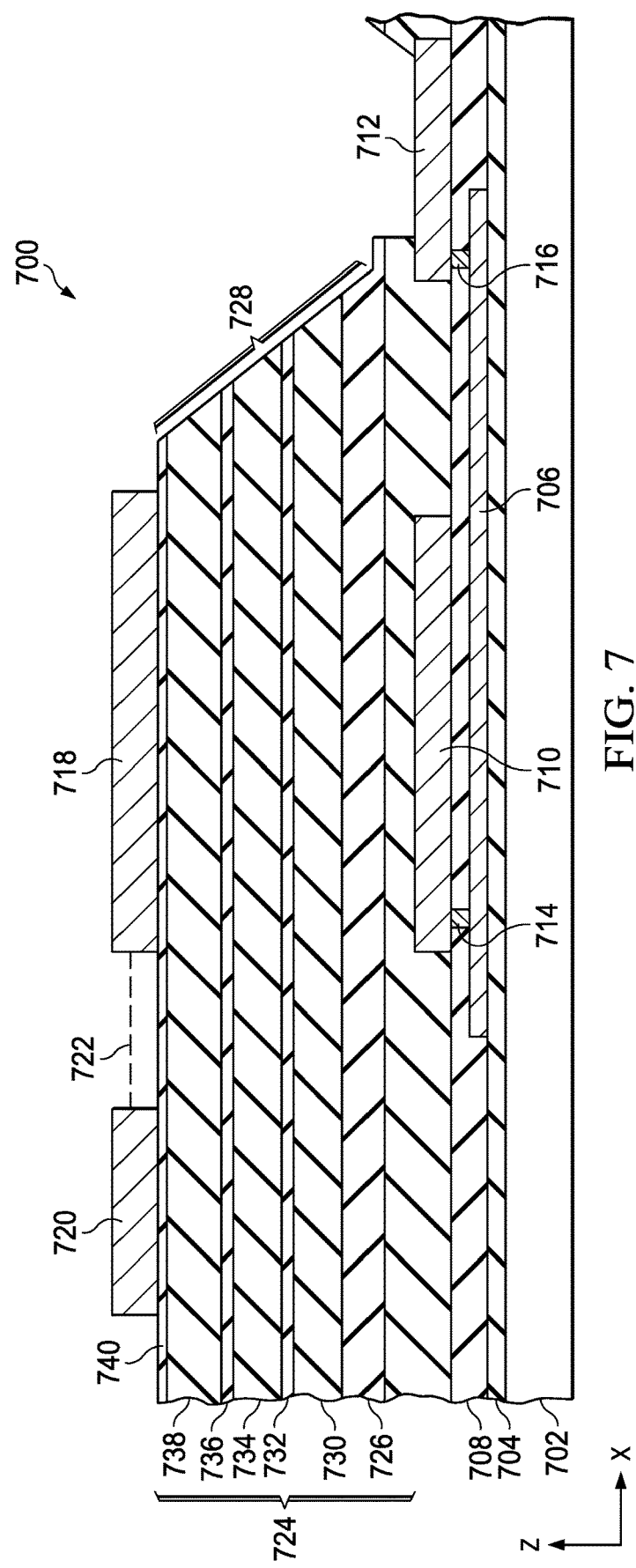
FIG. 7 is a cross-sectional view of an IC transformer.

FIG. 7 is a cross-sectional view of an IC transformer 700 that implements crack suppression consistent with portions of the above description. The IC transformer 700 is constructed with a semiconductor substrate 702, for example formed of silicon. A first PMD layer 704 is formed adjacent the semiconductor substrate 702, where the first PMD layer may be TEOS, and of a low compressive stress between −10 and −80 MPa (e.g., −20 MPa). A first metal layer 706 (M1 or metal-1) is formed above and in contact with the first PMD layer 704, which may be aluminum and with a thickness in the range of 0.3 µm and 0.7 µm (e.g., 0.5 µm). A first ILD layer 708 is formed above the first PMD layer 704 and also extending above the first metal layer 706. In a second metal layer (M2), a first coil structure 710 and a first contact pad 712 are formed. The coil structure 710 may be, for example, a figure-8 coil, which is not shown in detail so as to simplify the drawing, but which generally includes a first winding shown in part in FIG. 7 as the first coil structure 710, and with a spiral surrounding a first contact, a second winding with a spiral surrounding a second contact, and a conductor connecting the first and second winding. A portion of the first coil structure 710 may be connected to the first metal layer 706 by a first metal via 714, and the first contact pad 712 also may be connected to the first metal layer 706 by a second metal via 716. The transformer 700 also includes a second coil structure 718, formed higher in the z-dimension, for example as part of a third metal layer (M3), the third metal layer also including a second contact pad 720, with an electrical connection 722, shown by a dashed line in FIG. 7 rather than expressly showing a conductor, connecting the second contact pad 720 to the second coil structure 718. The second coil structure 718 also may be a figure 8-coil, with a spiral surrounding a first contact, a second winding with a spiral surrounding a second contact, and a conductor connecting the first and second winding.

An ILD layer stack 724 is formed generally between the first coil structure 710 and the second coil structure 718, thereby forming an insulator through which a magnetic field may be coupled between the two coil structures 710 and 718, and whereby the voltage difference between the two coil structures 710 and 718 can be large (e.g., 1,000 volts or higher). The ILD layer stack 724 includes plural layers, collectively having a thickness in a range from 16.0 µm to 20.0 µm. Within the ILD layer stack 724 may be an etch stop dielectric layer 726, so that a tapered edge 728 can be edged proximate a portion of the transformer 700, while stopping on the etch stop dielectric layer 726, for example without, or before, reaching the first contact pad 712. The ILD layer stack 724 also may include one or more layered combinations, as in the case of the above-described semiconductor structure 100, of relatively thicker dielectric layers (e.g., TEOS) separated by a thinner, for example nitrogen-containing, dielectric layer; a first example of this combination is shown in the z-dimension above the etch stop dielectric layer 726, where there is shown a first TEOS layer 730 above the etch stop dielectric layer 726, a first relatively thin nitrogen-containing layer 732 above the first TEOS layer 730, and a second TEOS layer 734 above the first relatively thin nitrogen-containing layer 730. The relatively thicker first and second TEOS layers 730 and 734 may have a thickness in the range of 0.5 µm to 5.0 µm, with one of the layers being 0.5 µm or greater, and the other being 2.0 µm or greater, while the relatively thin nitrogen-containing layer 730 has a thickness in the range of 0.1 µm to 0.5 µm. Additionally, the relatively thin nitrogen-containing layer 730 does not contact metal (e.g., in either the z-dimension or the x-dimension). The ILD layer stack 724 includes a second example of the same combination, namely, the second TEOS layer 734, above which is formed a thinner nitrogen-containing layer 736 that does not contact metal, above which is formed a thicker third TEOS layer 738, where again the relatively thicker second and third TEOS layers 734 and 738 may have a thickness in the range of 0.5 µm to 5.0 µm, with one of the layers being 0.5 µm or greater, and the other being 2.0 µm or greater. Finally, the ILD layer stack 724 may include an additional layer (or layers) 740, between the third TEOS layer 738 and both the second coil structure 718 and the second contact pad 720.

Given the preceding, the transformer 700 benefits from a relatively thick dielectric, here in the form of the ILD layer stack 724, with that stack providing the desirable dielectric function (here, a medium to separate magnetically coupled inductor coils) while also including crack mitigation in the stack. Crack mitigation is implemented by dividing or implementing the dielectric stack using plural layers, including within those layers one or more material-differentiating and relatively thin (e.g., nitrogen-containing) layers. Additionally, while not shown, a person of skill in the art will appreciate that the transformer 700 may include other layers, such as protective oxide or overcoat insulators and elements, such as electrical connection through solder ball and bond wires.

From the above, one skilled in the art should appreciate that examples are provided for IC semiconductor fabrication, for example with respect to improving thick dielectric stacks. Such examples provide various benefits, some of which are described above and including still others. For example, layer thickness may vary, and layer position, while shown as directly contacting in various example examples, may be separated in some instances by additional materials. As a final example, additional modifications are possible in the described examples, and other examples are possible, within the scope of the following claims.

What is claimed is:

1. An electronic device, comprising:
   a first conductive region;
   a second conductive region;
   a plurality of dielectric layers of a first material type between the first conductive region and the second conductive region; and
   at least one dielectric layer of a second material type, between a first dielectric layer in the plurality of dielectric layers of the first material type and a second dielectric layer in the plurality of dielectric layers of the first material type, the at least one dielectric layer of the second material type not contacting a metal.

2. The electronic device of claim 1 wherein the first material type does not include nitrogen and the second material type includes nitrogen.

3. The electronic device of claim 1:
   wherein the first dielectric layer in the plurality of dielectric layers of the first material type abuts the at least one dielectric layer of the second material type; and
   wherein the first dielectric layer in the plurality of dielectric layers of the first material type and the second dielectric layer in the plurality of dielectric layers of the first material type have a combined thickness in a range from 2.5 µm to 10.0 µm.

4. The electronic device of claim 3 wherein the second dielectric layer in the plurality of dielectric layers of the first material type abuts the at least one dielectric layer of the second material type.

5. The electronic device of claim 1 and further including a multi-stack structure between the first dielectric layer in the plurality of dielectric layers of the first material type and the second dielectric layer in the plurality of dielectric layers of the first material type, wherein the multi-stack structure includes the at least one dielectric layer of the second material type.

6. The electronic device of claim 5 wherein the multi-stack structure includes a first stack layer in the multi-stack structure that includes silicon oxynitride and a second stack layer in the multi-stack structure that includes silicon nitride.

7. The electronic device of claim 5 wherein the multi-stack structure includes:
   a first stack layer and a second stack layer in the multi-stack structure, each of which includes silicon oxynitride; and
   a third stack layer in the multi-stack structure, between the first stack layer and the second stack layer in the multi-stack structure, that includes silicon nitride.

8. The electronic device of claim 1 wherein the first material type has a compressive stress in a range from −10 MPa to −80 MPa and wherein the second material type has a compressive stress in a range from −81 MPa to −170 MPa.

9. The electronic device of claim 1 wherein the at least one dielectric layer of the second material type has a thickness in a range from 0.1 µm to 0.5 µm.

10. The electronic device of claim 1 wherein the first material type includes tetraethyl orthosilicate (TEOS).

11. The electronic device of claim 1 wherein the second material type includes silicon oxynitride.

12. The electronic device of claim 1 wherein the second material type includes silicon nitride.

13. The electronic device of claim 1:
   wherein the first conductive region includes a metal plate; and
   wherein the second conductive region includes a semiconductor substrate.

14. The electronic device of claim 1:
   wherein the first conductive region includes a first metal plate; and
   wherein the second conductive region includes a second metal plate.

15. The electronic device of claim 1:
wherein the first conductive region includes a first inductor coil; and
wherein the second conductive region includes a second inductor coil.

16. The electronic device of claim 1:
wherein the first conductive region includes a first metal region;
wherein the second conductive region includes a second metal region; and
wherein the electronic device is without a metal conductive path between the first metal region and the second metal region.

17. The electronic device of claim 1 wherein the at least one dielectric layer of the second material type does not contact a conductor or a semiconductor.

18. The electronic device of claim 1 wherein the at least one dielectric layer of the second material type abuts the first dielectric layer in the plurality of dielectric layers of the first material type and the second dielectric layer in the plurality of dielectric layers of the first material type, and none of the at least one dielectric layer of the second material type, the first dielectric layer in the plurality of dielectric layers of the first material type, nor the second dielectric layer in the plurality of dielectric layers of the first material type contacts a conductor or a semiconductor.

19. The electronic device of claim 1:
wherein the first conductive region is a metal-1 region;
wherein the second conductive region is a metal-2 region;
wherein the plurality of dielectric layers of the first material type is a first plurality of dielectric layers of the first material type;
wherein the at least one dielectric layer of the second material type is a first at least one dielectric layer of the second material type; and further including:
a second plurality of dielectric layers of the first material type between a semiconductor substrate and the metal-1 region; and
a second at least one dielectric layer of the second material type, between a first dielectric layer in the second plurality of dielectric layers of the first material type and a second dielectric layer in the second plurality of dielectric layers of the first material type.

20. The electronic device of claim 1 wherein the second material type includes one of either aluminum oxide or titanium oxide.

21. The electronic device of claim 1 wherein each dielectric layer of the first material type has a thickness in a range from 0.5 μm to 5.0 μm.

22. The electronic device of claim 1 wherein the at least one dielectric layer of the second material type has a thickness less than 2.0 μm.

23. The electronic device of claim 1 wherein the second material type differs from the first material type in at least one of compressive stress or elements in the first material type as compared to elements in the second material type.

24. An electronic device, comprising:
a semiconductor substrate;
a first metal region;
a second metal region;
a first dielectric stack, between the semiconductor substrate and the first metal region, wherein the first dielectric stack includes:
a first plurality of dielectric layers of a first material type; and
a first dielectric layer of a second material type, between a first dielectric layer in the first plurality of dielectric layers of the first material type and a second dielectric layer in the first plurality of dielectric layers of the first material type; and
a second dielectric stack, between the first metal region and the second metal region, wherein the second dielectric stack includes:
a second plurality of dielectric layers of the first material type; and
a second dielectric layer of the second material type, between a first dielectric layer in the second plurality of dielectric layers of the first material type and a second dielectric layer in the second plurality of dielectric layers of the first material type.

25. The electronic device of claim 24 wherein the electronic device is without a metal conductive path between the first metal region and the second metal region.

* * * * *